US012805096B2

(12) United States Patent
Dupre et al.

(10) Patent No.: US 12,805,096 B2
(45) Date of Patent: Nov. 17, 2026

(54) GROWTH SUBSTRATE OF A DIODE ARRAY, INCLUDING MESAS HAVING DIFFERENT POROSIFICATION LEVELS

(71) Applicant: COMMISSARIAT À L'ÉNERGIE ATOMIQUE ET AUX ÉNERGIES ALTERNATIVES, Paris (FR)

(72) Inventors: Ludovic Dupre, Grenoble (FR); Amélie Dussaigne, Grenoble (FR); Carole Pernel, Grenoble (FR); Fabien Rol, Grenoble (FR)

(73) Assignee: COMMISSARIAT À L'ÉNERGIE ATOMIQUE ET AUX ÉNERGIES ALTERNATIVES, Paris (FR)

(*) Notice: Subject to any disclaimer, the term of this patent is extended or adjusted under 35 U.S.C. 154(b) by 399 days.

(21) Appl. No.: 18/495,045

(22) Filed: Oct. 26, 2023

(65) Prior Publication Data

US 2024/0153986 A1 May 9, 2024

(30) Foreign Application Priority Data

Oct. 28, 2022 (FR) ........................................ 2211333

(51) Int. Cl.
*H10H 20/825* (2025.01)
*H10H 20/01* (2025.01)
(Continued)

(52) U.S. Cl.
CPC ...... *H10H 29/142* (2025.01); *H10H 20/0137* (2025.01); *H10H 20/818* (2025.01); *H10H 20/8252* (2025.01); *H10W 90/00* (2026.01)

(58) Field of Classification Search
CPC ......................... H10H 20/825; H10H 20/8252
See application file for complete search history.

(56) References Cited

U.S. PATENT DOCUMENTS 11,735,693 B2 8/2023 Pernel et al.
11,749,779 B2 9/2023 Pernel et al.
(Continued)

FOREIGN PATENT DOCUMENTS

EP 3840016 A1 6/2021
EP 3840065 A1 6/2021

OTHER PUBLICATIONS

Search Report for French application No. 2211333 dated Apr. 24, 2023.

*Primary Examiner* — Christopher A Johnson
(74) *Attorney, Agent, or Firm* — Chrisman Gallo Tochtrop LLC

(57) ABSTRACT

A growth substrate adapted for making by epitaxy an array of InGaN based diodes, including mesas $M_{(i)}$, made of GaN based crystalline materials, each including N doped layers, with N≥2, separated in pairs by an insulation intermediate layer made of a non-porous material, and each having a free upper face adapted for making a diode of the array by epitaxy; the mesas being configured according to at least three different categories including: a so-called $M_{(N)}$ mesas category where the N doped layers are porous; a so-called $M_{(0)}$ mesas category where none of the doped layers (13, 15) is porous; and a so-called $M_{(n)}$ mesas category where n doped layers are porous, with 1≤n<N.

9 Claims, 9 Drawing Sheets

(51) Int. Cl.
*H10H 20/818* (2025.01)
*H10H 29/14* (2025.01)
*H10W 90/00* (2026.01)

(56) References Cited

U.S. PATENT DOCUMENTS

| | | | | |
|---|---|---|---|---|
| 2021/0193870 | A1* | 6/2021 | Pernel ................ | H10H 20/8242 |
| 2022/0208848 | A1* | 6/2022 | Tan ...................... | H10H 20/817 |
| 2023/0053213 | A1* | 2/2023 | Ali ....................... | H10H 20/817 |

* cited by examiner

GROWTH SUBSTRATE OF A DIODE ARRAY, INCLUDING MESAS HAVING DIFFERENT POROSIFICATION LEVELS

CROSS-REFERENCE TO RELATED APPLICATIONS

This application claims priority from French Patent Application No. 2211333 filed on Oct. 28, 2022. The content of this application is incorporated herein by reference in its entirety.

TECHNICAL FIELD

The field of the invention is that of growth substrates including mesas enabling the manufacture of an array of diodes adapted to emit or detect, in a native manner, a light radiation at different wavelengths.

PRIOR ART

There are methods for manufacturing an array of light-emitting diodes adapted to emit, in a native manner, a light radiation at different wavelengths. The array of diodes may then include diodes adapted to emit a red light, other diodes adapted to emit a green light, and finally others adapted to emit a blue light. Such an array of diodes then forms a microscreen with an RGB native emission (standing for Red, Green, Blue).

The diodes are so-called with a native emission, to the extent that the active area of each diode emitting at a given wavelength differs from the active areas of the diodes emitting at another wavelength. In the case of the diodes made based on InGaN, the active areas differ from each other by the indium proportion in the quantum wells.

Thus, such an array of diodes with native emission differs from the color conversion technologies where all diodes emit at the same wavelength, for example in blue, and are each coated with a plot including luminophores, for example semiconductor nanocrystals forming quantum dots, to convert the incident light at least partially into a light with another wavelength.

To manufacture an array of diodes with native emission, one approach consists in using a growth substrate having mesas having been made partially porous during an electrochemical porosification step. This electrochemical porosification technique is disclosed in particular in the article by Griffin and Oliver entitled *Porous nitride semiconductors reviewed*, J. Phys. D: Appl. Phys. 53 (2020) 383002.

The document EP3840065A1 describes an example of a method for manufacturing a growth substrate then an array of diodes using the electrochemical porosification technique. The method includes making a growth substrate (also called pseudo-substrate) having several mesas made of InGaN, each formed by an InGaN doped layer made porous during an electrochemical porosification step, and an upper layer made of InGaN unintentionally doped or slightly doped so that it is not porosified (i.e. it remains intact or dense, and therefore non-porous). Afterwards, the diodes are made by resuming epitaxy starting from the upper layer.

The doped layers of the mesas may have different doping levels from one mesa to another, which results in a different porosification and therefore in a different relaxation rate. The diodes made from the different mesas then include quantum dots having a more or less significant indium proportion, thereby allowing obtaining emissive pixels at different wavelengths.

However, to obtain mesas whose InGaN doped layers have different doping levels from one mesa to another, it is necessary to perform, before the step of making the mesas, a step of locally implanting dopants in a full-wafer InGaN layer, with different doping levels, which might complicate the manufacturing process.

DISCLOSURE OF THE INVENTION

An objective of the invention is to overcome at least part of the drawbacks of the prior art, and more particularly to provide a growth substrate, and its manufacturing method, for manufacturing an array of diodes adapted to emit or detect, in a native manner, a light radiation at different wavelengths. This growth substrate may be manufactured by a simplified method compared to that of the prior art described before, as it does not include steps of localized implantation of dopants before making the mesas.

For this purpose, an object of the invention is a growth substrate adapted for making by epitaxy an array of InGaN based diodes, including:

- an insulation lower layer made of a GaN based non-porous crystalline material;
  - mesas $M_{(i)}$, with i ranging from 0 to N, made of GaN based crystalline materials, resting on and in contact with the insulation lower layer, and each including N doped layers, with N≥2, separated in pairs by an insulation intermediate layer made of a non-porous material, and each having a free upper face adapted for making a diode of the array by epitaxy; the mesas being configured according to at least three different categories including:
- a so-called $M_{(N)}$ mesas category where the N doped layers are porous;
  - a so-called $M_{(0)}$ mesas category where none of the doped layers is porous;
  - a so-called $M_{(n)}$ mesas category where n doped layers are porous, with 1≤n<N.

Each mesa $M_{(i)}$ may include an epitaxy regrowth layer resting on an upper doped layer amongst the N doped layers, made of an InGaN based non-porous crystalline material whose lattice parameter $a^{m}_{cre}$ of the relaxed material is greater than the effective lattice parameter $a^{e}_{cii}$ of the insulation lower layer:

- the epitaxy regrowth layer of each mesa $M_{(N)}$ having a maximum lattice parameter $a^{e}_{cre(N)}$;
  - the epitaxy regrowth layer of each mesa $M_{(0)}$ having a lattice parameter $a^{e}_{cre(0)}$ lower than $a^{e}_{cre(N)}$;
  - the epitaxy regrowth layer of each mesa M(n) having an intermediate lattice parameter $a^{e}_{cre(n)}$ lower than $a^{e}_{cre(N)}$ and different from $a^{e}_{cre(0)}$.

The insulation intermediate layer of each mesa may have a thickness smaller than that of the adjacent doped layers.

the insulation intermediate layer of each mesa may have a thickness comprised between 10 nm and 100 nm.

The insulation lower layer and the insulation intermediate layer may have a doping level at most equal to $5\times10^{17}$ $cm^{-3}$. Preferably, the insulation intermediate layer is unintentionally doped.

Preferably, the doped layers are n-type doped.

The lower doped layers of the mesas $M_{(i)}$ may be made of the same material and have the same thickness from one mesa to another; the insulation intermediate layers of the mesas $M_{(i)}$ are made of the same material and have the same thickness from one mesa to another; and the upper doped layers of the mesas $M_{(i)}$ are made of the same material and have the same thickness from one mesa to another.

The invention also relates to an optoelectronic device including a growth substrate according to any one of the preceding features; and an array of InGaN based diodes $D_{(i)}$, epitaxed starting from the mesas of the growth substrate, the diodes being adapted to emit or detect a light radiation at different wavelengths, the wavelength being different from one category of mesas $M_{(i)}$ to another.

The optoelectronic device may form an RGB microscreen where the diodes $D_{(i)}$ are light-emitting diodes configured to emit a light radiation at least in blue and red.

The invention also relates to a method for manufacturing a growth substrate according to any one of the preceding features, including the following steps:

- determining a value of an electrical voltage to be applied during a subsequent electrochemical porosification step;
  - making a crystalline stack, including, from the bottom to the top: an insulation lower continuous layer made of a GaN based crystalline material which cannot be porosified at said predetermined value of the electrical voltage to be applied; N doped continuous layers, with N≥2, made of GaN based crystalline materials which can be porosified at said predetermined value of the electrical voltage to be applied; at least one insulation intermediate continuous layer, separating the doped continuous layers in pairs, made of a GaN based crystalline material which cannot be porosified at said predetermined value of the electrical voltage to be applied;
  - locally etching the crystalline stack, so as to form said mesas $M_{(i)}$;
  - making several electrodes, in contact with the doped layers to be porosified according to the different mesas categories $M_{(i)}$;
  - electrochemically porosifying said doped layers to be porosified simultaneously, by application of the predetermined value of the electrical voltage to the doped layers to be porosified.

The material of the insulation lower continuous layer and the material of the insulation intermediate continuous layer may have a doping level lower than a predefined minimum value starting from which they could be porosified given the predetermined value of the electrical voltage applied during the porosification step.

The manufacturing method may include the following steps:

- following the porosification step, removing the electrodes, then conformally depositing an insulating thin layer covering the mesas;
  - depositing a filling thick layer, filling the spaces between the mesas, and thinning the filling thick layer so as to make free an upper portion of the insulating thin layer covering an upper surface of the mesas $M_{(i)}$;
  - selectively etching the upper portion of the insulating thin layer, selectively at the mesas $M_{(i)}$, making free the upper surface of these.

The crystalline stack may comprise an InGaN based epitaxy regrowth continuous layer, resting on an upper doped continuous layer amongst the N doped continuous layers.

After the porosification step, an InGaN based epitaxy regrowth layer may be made over an upper doped layer amongst the N doped layers of each mesa $M_{(i)}$.

The invention also relates to a method for manufacturing an optoelectronic device according to any one of the preceding features including the following steps:

- manufacturing the growth substrate by the method according to any one of the preceding features; then
  - making an array of diodes $D_{(i)}$ by epitaxy starting from the mesas $M_{(i)}$ of the growth substrate, the diodes then being adapted to emit or detect a light radiation at different wavelengths, the wavelength being different from one category of mesas $M_{(i)}$ to another.

BRIEF DESCRIPTION OF THE DRAWINGS

Other aspects, aims, advantages and features of the invention will appear better upon reading the following detailed description of preferred embodiments thereof, given as a non-limiting example, and made with reference to the appended drawings wherein.

DETAILED DISCLOSURE OF PARTICULAR EMBODIMENTS

In the figures and in the following description, the same references represent identical or similar elements. In addition, the different elements are not plotted to the scale so as to favor clarity of the figures. Moreover, the different embodiments and variants do not exclude each other and could be combined together. Unless stated otherwise, the terms “substantially”, “about”, “in the range of” mean within a 10% margin, and preferably within a 5% margin. Moreover, the terms “comprised between . . . and . . . ” and the same mean that the bounds are included, unless stated otherwise.

The invention relates to a growth substrate suitable for the manufacture by epitaxy of an array of InGaN based diodes, the diodes allow emitting or detecting, in a native manner, a light radiation at different wavelengths. It also relates to an optoelectronic device including the growth substrate and the array of diodes. Finally, it relates to methods for manufacturing the growth substrate and the optoelectronic device.

The optoelectronic device may be a microscreen with a native emission, for example of the RGB type. The diodes may consist of light-emitting diodes or laser diodes. Alternatively or complementarily, the optoelectronic device may be a detection device, the diodes then consisting of photodetectors.

Figure 1A:
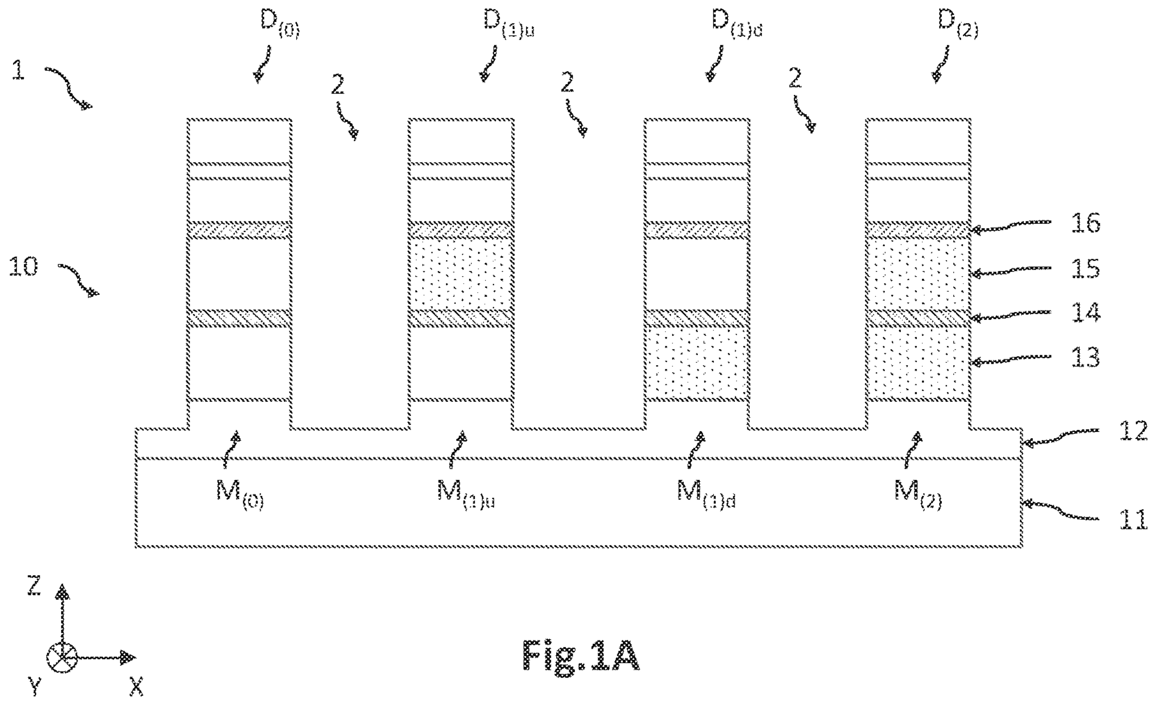
FIG. 1A is a schematic and partial view, in cross-section, of an optoelectronic device according to one embodiment, including a growth substrate and an array of diodes.
Figure 1B:
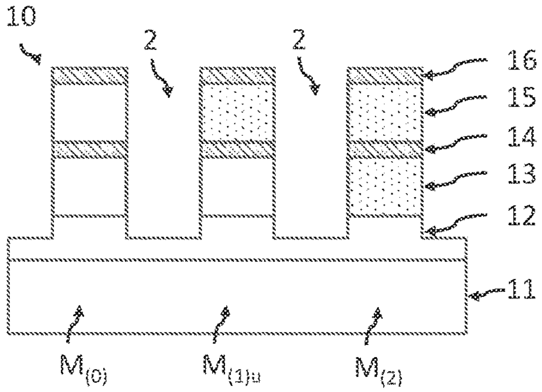
FIG. 1B is a schematic and partial view, in cross-section, of a growth substrate according to a first variant.
Figure 1C:
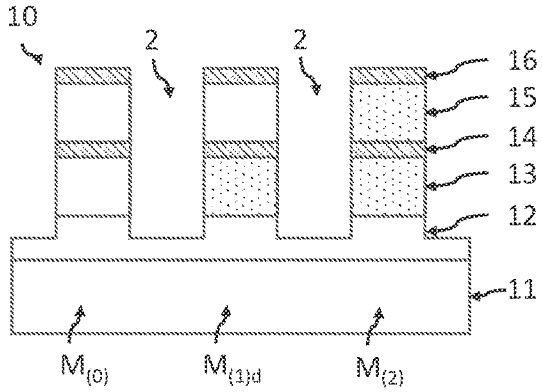
FIG. 1C is a schematic and partial view, in cross-section, of a growth substrate according to a second variant.

FIG. 1A is a schematic and partial view of an optoelectronic device 1, according to one embodiment. The optoelectronic device 1 is herein a microscreen with an RGB native emission, where the step of the diodes $D_{(i)}$ could be smaller than or equal to about 10 μm. the index i, ranging from 0 to N, relates to the categories (disclosed hereafter) of the mesas $M_{(i)}$ and therefore of the diodes $D_{(i)}$. FIG. 1B illustrates a first variant where the growth substrate 10 includes the mesas types $M_{(0)}$, $M_{(1)u}$ and $M_{(2)}$, and FIG. 1C illustrates a second variant where the growth substrate 10 includes the mesas types $M_{(0)}$, $M_{(1)d}$ and $M_{(2)}$.

An orthogonal three-dimensional direct reference frame XYZ is defined herein and for the following description, where the axes X and Y form a main plane of a support layer 11, 12, and where the axis Z is oriented along the thickness of the growth substrate 10, in the direction of the diodes $D_{(i)}$.

In general, the optoelectronic device 1 includes a growth substrate 10 starting from which an array of diodes $D_{(i)}$ has been made by epitaxy. For clarity, the electrical polarization electrodes of the diodes are not shown herein.

In general, the growth substrate 10 includes a support layer herein formed by a support substrate 11 and by an insulation lower layer 12, and mesas $M_{(i)}$ each intended for making by epitaxy regrowth a diode $D_{(i)}$ of the array. A mesa (i.e. a protrusion, a relief) is a portion of the growth substrate 10 projecting from the support layer. The mesas are made by localized etching of an initial crystalline stack.

The growth substrate 10 is made from crystalline GaN, i.e. it is made of GaN and/or of its compounds such as $In_xGa_{1-x}N$, $I'Al_yGa_{1-y}N$, and possibly $I'In_xAl_yGa_{1-x-y}N$. More specifically, the mesas $M_{(i)}$ include N doped layers 13, 15 separated in pairs by an insulation intermediate layer 14. An epitaxy regrowth layer 16, which may be made before or after the electrochemical porosification step, rests on the upper doped layer 15.

In general, by GaN based material, it should be understood that the material may consist of GaN and/or its compounds. Thus, it may be $InxAl_yGa_{1-x-y}N$ where the indium proportion w may be zero and where the aluminum proportion y may also be zero. And by InGaN based material, it should be understood that it is made of InGaN or of InAlGaN. Thus, it may be made of $In_xAl_yGa_{1-x-y}N$ where the indium proportion x is different from zero and where the aluminum proportion y may be zero.

The mesas $M_{(i)}$ are classified into different categories, depending on whether they include, or not, one or more porous doped layer(s). As explained later on, some doped layers are made porous during the same electrochemical porosification step of the manufacturing process. The different categories are called $M_{(i)}$, with i ranging from 0 to N, depending on whether the mesa includes 0, 1, 2 . . . N porous doped layers. In this example, N is equal to 2.

Each mesa $M_{(i)}$ is obtained by localized etching of the initial crystalline stack 20 (cf. FIG. 5A or FIG. 6A), and includes the N doped layers 13, 15 (derived from the continuous layers 23, 25) separated in pairs by an insulation intermediate layer 14 (derived from the continuous layer 24), and, in this example, terminates along the direction +Z in the epitaxy regrowth layer 16 (derived from the continuous layer 26, cf. FIG. 5A) which forms the upper face $F_{(i)}$ of the mesa $M_{(i)}$. The mesas $M_{(i)}$ may have been formed through one or more etching step(s), for example by dry etching, so that their sidewalls could be substantially vertical.

The different mesas categories $M_{(i)}$ differ from each other by different porosification levels $P_{(i)}$ from one mesas category to another, which then allow for different relaxation rates $R_{(i)}$. A porosification level $P_{(i)}$ is defined by the number of porous doped layers 13, 15 that the considered mesa $M_{(i)}$ includes. The mesas $M_{(i)}$ of the growth substrate 10 are configured so as to form at least three different categories including:

- a category $M_{(N)}$ where all of the doped layers 13, 15 are porous, the porosification level, denoted $P_{(N)}$, is maximum, and then allows for a maximum relaxation rate $R_{(N)}$. The epitaxy regrowth layer 16 then has a maximum effective lattice parameter $a^e_{cre(N)}$ substantially equal to the value of its bulk material $a^m_{cre}$;
- a category $M_{(0)}$ where none of the doped layers 13, 15 is porous, the porosification level, denoted $P_{(0)}$, is minimum, and then allows for a minimum relaxation rate $R_{(0)}$. The epitaxy regrowth layer 16 then has an effective lattice parameter $a^e_{cre(0)}$ lower than $a^e_{cre(N)}$, and substantially equal to the effective lattice parameter of the insulation lower layer $a^e_{cii}$;
- a category $M_{(n)}$ where n doped layers 13, 15 are porous, with 1≤n<N, the porosification level, denoted $P_{(n)}$, is intermediate and then allows for an intermediate relaxation rate $R_{(n)}$ comprised between $R_{(0)}$ and $R_{(N)}$. the epitaxy regrowth layer 16 then has an effective lattice parameter $a^e_{cre(n)}$ lower than the maximum value $a^e_{cre(N)}$ and different from the value $a^e_{cre(0)}$.

The relaxation rate $R_{(i)}$ of a mesa $M_{(i)}$ depends on the porosification level $P_{(i)}$ and the lattice parameters of the non-porous doped layers of the mesas. The relaxation rates $R_{(i)}$ are reflected by the fact that the epitaxy regrowth layers 16 have different values of the effective lattice parameter, from one mesa category to another. Also, the diodes $D_{(i)}$, made during the same epitaxy regrowth step, have different active areas, in terms of indium proportion incorporated in the quantum wells, from one category of diodes $D_{(i)}$ to another (and therefore of mesas) and will therefore be adapted to emit or detect a light radiation at different wavelengths.

In the context of the invention, a doped layer 13, 15 of a mesa $M_{(i)}$ may be made porous during the electrochemical porosification step implemented in the process of manufacturing the growth substrate 10. The doped layer then passes from a so-called dense initial structure (non-porous initial state) into a porous structure (porous final state). This porosification is reflected by the presence of pores which extend in the volume of the layer starting from its free surface (having been brought into contact a liquid electrolyte) as described in the aforementioned article by Griffin and Oliver 2020. The porosification of a doped layer may be adjusted according to the doping level $N_D$ of the latter, and the operating conditions during the electrochemical porosification step (nature and/or concentration of the electrolyte, applied electrical voltage Ep, porosification duration . . . ). The porosification of the layer may be defined by a porosity rate (ratio of the volume of the pores to the total volume of the layer) and by the average size of the pores. Note that the porous or non-porous state of a doped layer may be characterized by means of a characterization system such as a SEM (scanning electron microscopy) imaging system or an ellipsometric or ellipse-porosimetric type direct measurement system.

Figure 2:
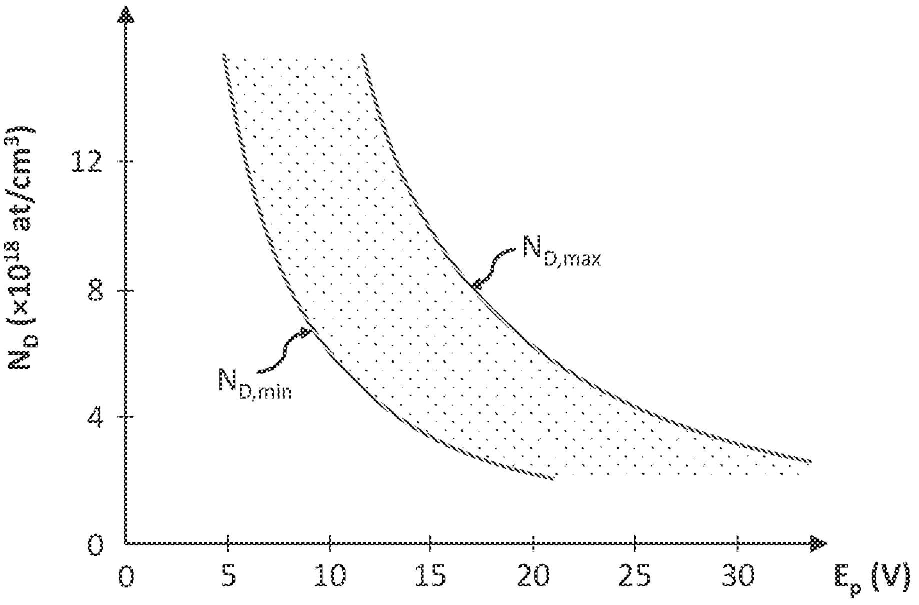
FIG. 2 illustrates an example of a relationship between the doping level of a doped crystalline layer as a function of the applied electrical voltage, highlighting the domain of existence of the electrochemical porosification.

In general, the electrochemical porosification reaction is a selective reaction to the extent that, for the same applied electrical voltage Ep, a doped crystalline semiconductor material based on GaN will be porosified if its doping level $N_D$ is higher than or equal to a predefined minimum doping level $N_{D,min}$. Otherwise, it will not be porosified and will remain intact (dense). In this respect, FIG. 2 illustrates an example of the domain of existence of the electrochemical porosification as a function of the doping level $N_D$ (herein in terms of donors) of the GaN based crystalline material and of the applied electrical voltage Ep, as described in particular in the document EP3840016A1.

The minimum doping level $N_{D,min}$ depends on the electrical voltage $E_p$ according to a decreasing function: the higher the electrical voltage $E_p$, the higher the minimum doping level $N_{D,min}$ required to porosify the crystalline level will be. In other words, for a predefined value of the electrical voltage $E_p$ applied during the electrochemical porosification step, the crystalline material having a doping level $N_D$ lower than the minimum value $N_m$ in will not be porosified (made porous) and will therefore remain intact or dense (non-porous): this material could therefore be described as "unable to be porosified". However, for this same value $E_p$, this same material, when it has a doping level $N_D$ at least equal to the minimum value $N_{D,min}$ will be porosified (made porous) and could therefore be described as "able to be porosified".

Also, the GaN based crystalline materials are said, able to be porosified or not, given the same predefined value $E_p$ of the electrical voltage that is applied during the electrochemical porosification step, according to the same predefined minimum value $N_{D,min}$ of the doping level. In the context of the invention, the doped layers 13, 15 are made of a GaN based crystalline material said "able to be posorisified", while the insulation lower layer 12 and the insulation intermediate layer 14 are made of a GaN based crystalline material said "not able to be porosified".

The porosification of all of the N doped layers of the mesas $M_{(i)}$, or of only one of them, allows obtaining a more or less significant relaxation within the mesas $M_{(i)}$. Thus, a porosified doped layer becomes deformable, and will enable a partial or total relaxation of the non-porous upper layer(s), whether this consists of the upper doped layer 15 if it is non-porous and/or of the epitaxy regrowth layer 16. Also, the growth substrate 10 may have the following characteristics:

- in the mesas $M_{(N)}$ where the porosification level $P_{(N)}$ is maximum, the fact that all of the doped layers 13, 15 have become porous therefore make them deformable to the mechanical stresses generated by the epitaxy regrowth layer 16, so that the latter is relaxed and has an effective lattice parameter $a^e_{cre(N)}$ that could then be substantially equal to that of its bulk material $a^m_{cre}$: $a^e_{cre(N)} \approx a^m_{cre}$;
- in the mesas $M_{(0)}$ where the porosification level $P_{(0)}$ is minimum, since none of the doped layers 13, 15 has been made porous and therefore deformable, the epitaxy regrowth layer 16 continues undergoing the mechanical stresses generated by the insulation lower layer 12, and therefore has an effective lattice parameter $a^e_{cre(0)}$ that could be substantially equal to that of the insulation lower layer 12: $a^e_{cre(0)} \approx a^e_{cii}$;
- in the mesas $M_{(n)}$ where the porosification level $P_{(n)}$ is intermediate, a porosified doped layer will therefore be made deformable and will enable the non-porous upper layer (the doped layer 15 and/or the epitaxy regrowth layer 16 to be partially relaxed:
  - if the porous layer is the lower doped layer 13, and the upper doped layer 15 is not porous and is made of AlGaN, the latter is then partially relaxed thanks to the porous doped layer 13, the epitaxy regrowth layer 16 then having an effective lattice parameter $a^e_{cre(n)}$ which could be lower than $a^e_{cre(0)}$. It will then be possible to have a growth substrate 10 where: $a^e_{cre(n)} < a^e_{cre(0)} < a^e_{cre(N)}$.
  - if the porous layer is the lower doped layer 13 and the upper doped layer 15 is non-porous and is made of InGaN, or if the porous layer is the upper doped layer 15, then the epitaxy regrowth layer 16 has an effective lattice parameter $a^e_{cre(n)}$ which could be higher than $a^e_{cre(0)}$. It will then be possible to have a growth substrate 10 where: $a^e_{cre(0)} < a^e_{cre(n)} < a^e_{cre(N)}$.

The support substrate 11 is herein made of a material that cannot be porosified, so that it remains non-porous (dense) during the porosification step, at the predefined polarization electrical voltage. It may consist of a material that is inert to the porosification electrochemical reaction, such as an insulating material. It may consist of a GaN based semiconductor material whose doping level is lower than the porosification minimum value $N_{D,min}$ (the value associated with the predefined polarization electrical voltage): it could then be unintentionally doped or slightly doped. For example, the support substrate 11 may be made of sapphire, of silicon, of SiC, of freestanding GaN, inter alia. For example, it has a thickness comprised between about 300 μm and 1 mm. The support substrate 11 may be absent, the insulation lower layer 12 then being a thick layer of several microns, of tens of microns, and possibly of hundreds of microns.

The insulation lower layer 12 is made of a crystalline material that cannot be porosified based on GaN so that it remains non-porous (dense) during the porosification step, at the predefined polarization electrical voltage. Preferably, the material herein consist of GaN whose doping level is lower than the predefined minimum value $N_{D,min}$. It could then be unintentionally doped or slightly doped, for example have a doping level at most equal to $5\times10^{17}$ $cm^{-3}$. To the extent that it cannot be porosified as it is unintentionally doped or slightly doped, this insulation lower layer 12 has a sufficient electrical resistance to avoid the lower doped layer 13 of the mesas $M_{(0)}$ and that of the $M_{(1)u}$ being porosified. In other words, the lower doped layer 13 of the mesas $M_{(0)}$ and that of the mesas $M_{(1)u}$, which are not in contact with a polarization electrode, have an electrical potential that is low enough for the polarization electrochemical reaction not taking place.

The insulation lower layer 12 herein has a thickness for example comprised between about 100 nm and 6 μm. It has been made by epitaxy starting from the support substrate 11 and thus rests on and in contact with the latter (but an intermediate layer may be present). It may be continuous, or not, in the plane XY. Moreover, the insulation lower layer 12 has a so-called effective lattice parameter lower than that of bulk $In_xGa_{1-x}N$ of the epitaxy regrowth layer 16.

Each of the doped layers 13, 15 is made of a doped crystalline semiconductor material that can be porosified, based on GaN. They are intended to be made porous or not during the electrochemical porosification step, depending on the category of the corresponding mesa, so as to obtain the desired relaxation rate. Also, the material has a doping level at least equal to the predefined minimum value $N_{D,min}$. The material may be selected from among InGaN, AlGaN, InAlGaN, and/or InGaN (indium proportion different from zero). According to a variant that is disclosed hereafter, the upper doped layer 15 is made of AlGaN while the lower doped layer 13 is made of InGaN.

Moreover, the doped layers 13, 15 preferably have the same conductivity type, herein an n-type doping, but they may be p-type doped. For example, they have a thickness comprised between about 50 nm and 1 μm, herein equal to about 800 nm. The doped layers 13, 15 of the same mesa $M_{(i)}$ may have the same thickness or a different thickness from one doped layer to another.

Each mesa $M_{(i)}$ includes at least one insulation intermediate layer 14, which separates the doped layers 13, 15 in pairs, along the axis Z. It allows making the mesas $M_{(1)}$ while ensuring, during porosification of one of the doped layers (for example the doped layer 15 in the mesa $M_{(1)u}$), insulation of the other adjacent doped layer so that it is not porosified (herein the doped layer 13 in the mesa $M_{(1)u}$). The insulation intermediate layer 14 is made of a crystalline semiconductor material that cannot be porosified, based on GaN. Also, the material remains non-porous (dense) during the electrochemical porosification step. The material may be selected from among InGaN, AlGaN, InAlGaN, and/or GaN, and has a doping level lower than the predefined minimum value $N_{D,min}$. Thus, it could be unintentionally doped or slightly doped, for example have a doping level at most equal to $5\times10^{17}$ $cm^{-3}$.

To the extent that cannot be porosified as it is unintentionally doped or slightly doped (and preferably unintentionally doped), this insulation intermediate layer 14 has a sufficient electrical resistance to avoid the lower doped layers 13 of the mesas $M_{(1)u}$, as well as the upper doped layers 15 of the mesas $M_{(1)d}$, not being porosified. In other words, as regards for example the mesas $M_{(1)u}$, the lower doped layers 13, which are not in contact with a polarization electrode, have an electrical potential that is low enough by the presence of the insulation intermediate layer 14, for the polarization electrochemical reaction not taking place.

The insulation intermediate layer 14 is made by epitaxy starting from the doped underlayer. Preferably, it is in contact with the adjacent doped layers 13, 15. Its thickness is selected so as to ensure, on the one hand, a good insulation (a sufficient electrical resistance) between the two adjacent doped layers 13, 15 during the electrochemical porosification step and, on the other hand, a good transmission of mechanical stresses along the axis Z. It is smaller than those of the doped layers 13, 15. Preferably, it is comprised between 10 nm and 100 nm, and preferably between about 10 nm and 50 nm.

The epitaxy regrowth layer 16 is a later of the growth substrate 10 that could be made before the electrochemical porosification step, i.e. during the manufacture of the growth substrate 10, and could possibly be made after the electrochemical porosification step, for example during the manufacture of the array of diodes $D_{(i)}$. It is made of an InGaN based crystalline material which may be selected from among InGaN and InAlGaN, and is intended to allow making the diodes $D_{(i)}$ by epitaxy regrowth. It is herein made by epitaxy starting from the upper doped layer 15.

In the case where the epitaxy regrowth layer 16 is made before the electrochemical porosification step (in the context of the method for manufacturing the growth substrate 10, cf. FIG. 5A-5H), it is made of a material that cannot be porosified. Also, the material remains non-porous (dense) upon the electrochemical porosification step. The material then has a doping level lower than the predefined minimum value $N_{D,min}$. In this example, it is made of unintentionally doped or slightly doped $In_xGa_{1-x}N$, with an indium proportion x different from zero. Alternatively, in the case where the epitaxy regrowth layer 16 is made, after the electrochemical porosification tep, for example during manufacture of the array of diodes $D_{(i)}$ (cf. FIG. 6D), regardless of whether it is made of a material that can be porosified or not. Note that in the latter case, the epitaxy regrowth layer may be one of the doped layers forming the semiconductor junction of a diode $D_{(i)}$.

The epitaxy regrowth layer 16 has a thickness and an indium proportion x different from zero such that they contribute in obtaining the desired relaxation rates $R_{(i)}$ for the mesas $M_{(1)}$ and $M_{(2)}$, as explained in detail later on. For example, it has a thickness of about 200 nm and an indium proportion x at least equal to 8%. They may have a smaller thickness, for example of about 100 nm, and a higher indium proportion x, for example at least of about 12%.

Note herein that each of the doped layers 13, 15 and the insulation intermediate layer 14 (and the epitaxy regrowth layer 16 where appropriate) has a thickness smaller than its critical thickness at which there is a plastic relaxation of the mechanical stresses. The total thickness of the stack of these layers is also smaller than a predefined critical thickness so as to remain pseudomorphically stressed on the insulation lower layer 12. Thus, the insulation lower layer 12 generates, in the doped layers 13, 14, 15, mechanical stresses (oriented in the plane XY) whose value is such that, before porosification, the lattice parameter at the upper face of the mesas $M_{(i)}$ is close or substantially equal to the effective lattice parameter $a^e_{cii}$ of the insulation lower layer 12.

To the extent that the mesas $M_{(i)}$ are made starting from the same initial crystalline stack 20, each layer of a mesa $M_{(i)}$ is coplanar with the corresponding layers of the other mesas. Thus, the epitaxy regrowth layers 16 are coplanar with each other and define upper faces which are also coplanar. The lower doped layers 13 are coplanar with each other. The same applies to the insulation intermediate layers 14 on the one hand, and to the upper doped layers 15 on the other hand.

In addition, each layer of a mesa $M_{(i)}$ has a thickness identical to that of the corresponding layers of the other mesas. Thus, the epitaxy regrowth layers 16 have the same thickness therebetween. The same applies to the lower doped layers 13, to the intermediate layers 14, and finally to the upper doped layers 15. As indicated before, the layers 14, 16 have a thickness smaller than those of the doped layers 13, 15.

In the example of FIG. 1B, the growth substrate 10 includes an insulation lower layer 12 made of GaN stressed by the substrate 11 made of sapphire (herein, lattice parameter of 3.184 Å), and includes from the bottom to the top: a lower doped layer 13 made of InGaN, an insulation intermediate layer 14 made of InGaN, and an upper doped layer 15 made of InGaN, and finally an epitaxy regrowth layer 16 made of InxGa1−xN with a thickness of about 200 nm and an indium proportion x equal to about 8%. The mesa $M_{(0)}$ has a minimum relaxation rate $R_{(0)}$ so that the epitaxy regrowth layer 16 has a lattice parameter close or substantially equal to that (3.184 Å) of the insulation lower layer 12. The mesa $M_{(N)}$ has a maximum relaxation rate $R_{(N)}$ so that the epitaxy regrowth layer 16 has a lattice parameter close or substantially equal to that of bulk $In_{0.08}Ga_{0.92}N$ (about 3.217Λ), because of the elastic deformation of the porous doped layers 13 and 15. The mesa $M_{(1)u}$ has an intermediate relaxation rate $R_{(1)u}$ so that the epitaxy regrowth layer 16 has a lattice parameter comprised between 3.184 Å and 3.217 Å. Hence, we have $a^e_{cre(0)}<a^e_{cre(1)u}<a^e_{cre(N)}$. Thus, the array of diodes may then include diodes $D_{(0)}$ emitting in blue, diodes $D_{(1)u}$ emitting in green, and diodes $D_{(N)}$ emitting in red.

In the example of FIG. 1C, the growth substrate 10 is identical to that of FIG. 1B, except that the upper doped layer 15 is made of AlGaN. The mesas $M_{(0)}$ and $M_{(N)}$ have substantially the same characteristics as in FIG. 1B. However, as regards the mesa $M_{(1)d}$, the porosification of the doped layer 13 makes it elastically deformable, so that the mechanical stresses of the doped layer 15 made of AlGaN could then deform the porous doped layer 13, which in return will enable the doped layer 15 to be relaxed at least partially and therefore have a lattice parameter lower than that of the insulation lower layer 12. Also, the epitaxy regrowth layer 16, epitaxed starting from the AlGaN of the doped layer 15, has a lattice parameter lower than that of the mesa $M_{(0)}$. Hence, we have $a^e_{cre(1)d}<a^e_{cre(0)}<a^e_{cre(N)}$. Thus, the array of diodes may then include diodes $D_{(1)d}$ emitting in blue, diodes $D_{(0)}$ emitting in green, and diodes $D_{(N)}$ emitting in red.

Thus, the growth substrate 10 includes mesas of different categories $M_{(i)}$ having different porosification levels $P_{(i)}$, allowing for different relaxation rates $R_{(i)}$. Such a growth substrate 10 then allows making an array of diodes $D_{(i)}$ adapted to emit or receive, in a native manner, a light radiation at different wavelengths. This growth substrate 10 is obtained starting from an original crystalline stack 20 made of N doped layers 13, 15 separated in pairs by an insulation intermediate layer 14, wherein only some of the doped layers are made porous during the same electrochemical porosification step, thanks to the presence of the insulation intermediate layer 14. Because it is made of a material that cannot be porosified (because it is unintentionally doped or slightly doped), this insulation intermediate layer 14 allows, thanks its electrical resistance, avoiding that the porosification electrochemical reaction takes place in the adjacent doped layer that should not be porosified. Thus, the different mesas categories $M_{(i)}$ are obtained, without it being necessary to carry out steps of localized implantation of dopants like in the aforementioned manufacturing method of the prior art.

Figure 3A:
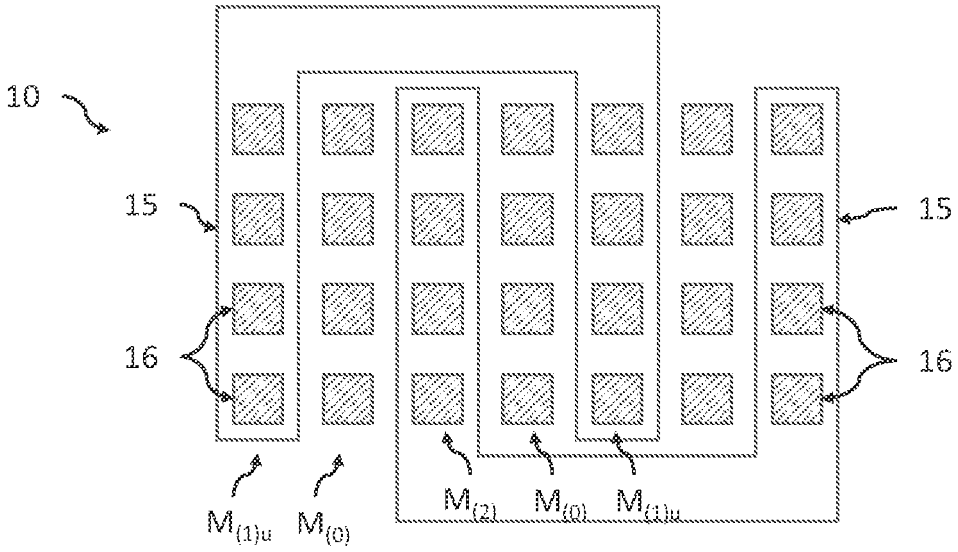
FIGS. 3A to 3C are schematic and partial view, in top view (FIG. 3A), in cross-sectional view (FIG. 3B), and in perspective view (FIG. 3C) of a growth substrate according to one variant.
Figure 3B:
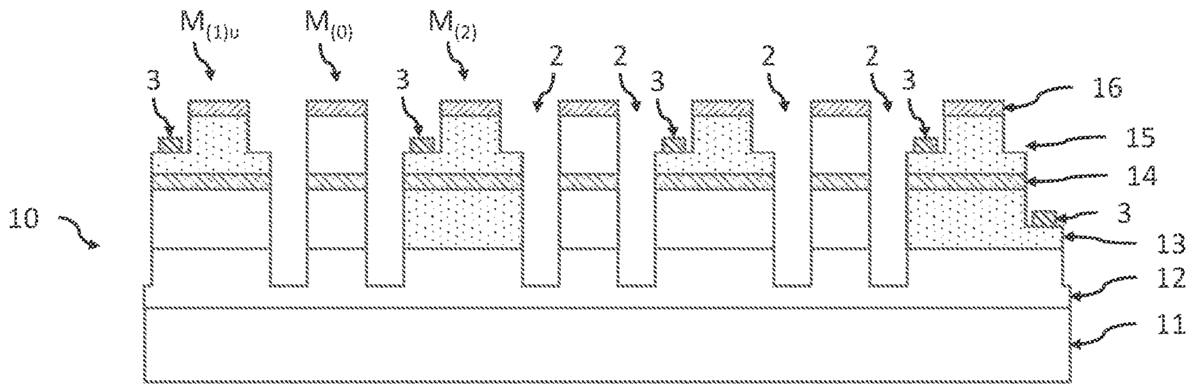
Figure 3C:
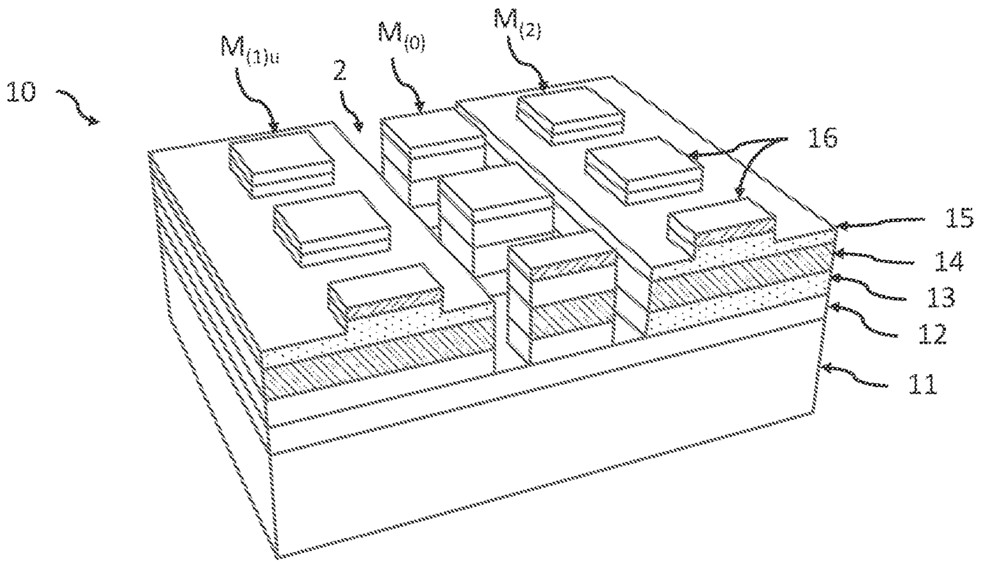

FIGS. 3A to 3C illustrate, in top view (FIG. 3A), in cross-section (FIG. 3B), and in perspective (FIG. 3C), a growth substrate 10 similar to that of FIG. 1B, which includes several mesas $M_{(0)}$, several mesas $M_{(1)u}$ and several mesas $M_{(2)}$. In this example, the mesas $M_{(1)u}$ and the mesas $M_{(2)}$ are separated by the mesas $M_{(0)}$ along the axis X. The mesas $M_{(0)}$, $M_{(1)u}$ and $M_{(2)}$ are respectively aligned along the axis Y. Of course, other arrangements are possible.

The upper doped layer 15 of the mesas $M_{(1)u}$ is herein continuous and extend continuously in the plane XY to connect together all of the mesas $M_{(1)u}$ of the growth substrate 10. In other words, each porous doped layer 15 of the mesas $M_{(1)u}$ is a portion of the same porous continuous layer which extends from one mesa $M_{(1)u}$ to another. The same applies to the upper and lower doped layers of the mesas $M_{(2)}$ which extend continuously in the plane XY to connect together the mesas $M_{(2)}$ of the growth substrate 10.

The epitaxy regrowth layers 16 remain distinct from one mesa $M_{(1)u}$ to another in the plane XY. The same applies to the mesas $M_{(2)}$. A trench 2 which opens onto the insulation lower layer 12 separates the mesas $M_{(0)}$ from the mesas $M_{(1)u}$ on the one hand, and from the mesas $M_{(2)}$ on the other hand. This same trench 2 separates the mesas $M_{(0)}$ from each other in the plane XY.

The upper doped layer 15 of the mesas $M_{(1)u}$ and $M_{(2)}$ includes an indentation thereby defining a top portion having substantially identical dimensions in the plane XY as the epitaxy regrowth layer 16, and a bottom portion having larger dimensions. The indentation may be used to deposit an electrode 3 therein, this electrode 3 being connected to an electric generator during the electrochemical porosification step (for example to the anode of the generator). This indentation and the electrode 3 may be present at all mesas $M_{(1)u}$ and $M_{(2)}$, or only at those located at the boundary of the growth substrate 10.

In addition, the lower doped layer 13 of the mesas $M_{(2)}$ also includes an indentation thereby defining a top portion having substantially identical dimensions in the plane XY as the bottom portion of the upper doped layer 15, and a bottom portion having larger dimensions. The indentation is also used herein to deposit an electrode 3 therein, this electrode 3 being connected to the electric generator (herein, also to the anode). This indentation and the electrode 3 may be present at all mesas $M_{(2)}$, or only at those located at the boundary of the growth substrate 10.

Note that these indentations may be absent, and the anode of the generator may be electrically connected to a lateral surface of the upper doped layer 15 of the mesas $M_{(1)u}$ and $M_{(2)}$ and to a lateral surface of the lower doped layer 13 of the mesas $M_{(2)}$.

Figure 4A:
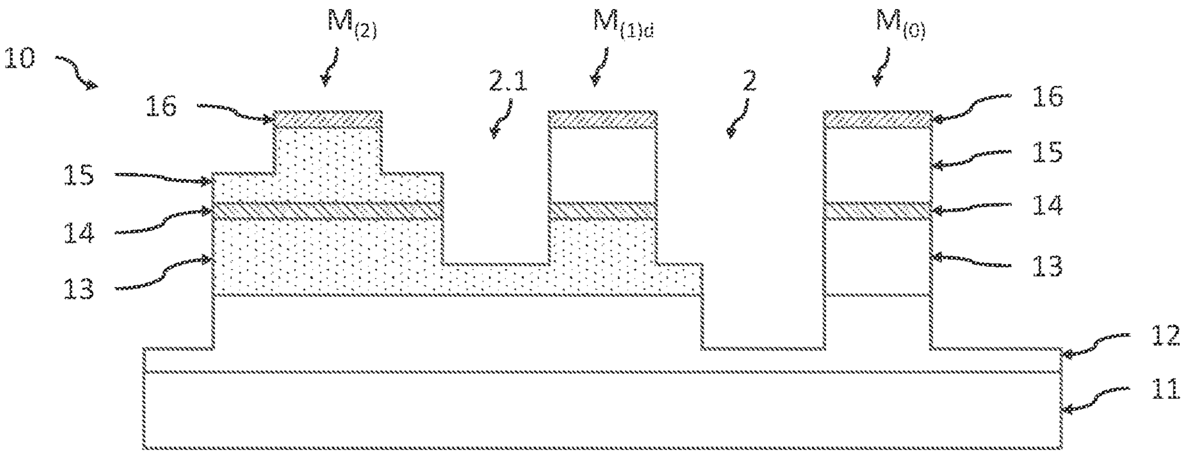
FIGS. 4A and 4B are schematic and partial view, in cross-section (FIG. 4A) and in perspective (FIG. 4B), of a growth substrate according to another variant.
Figure 4B:
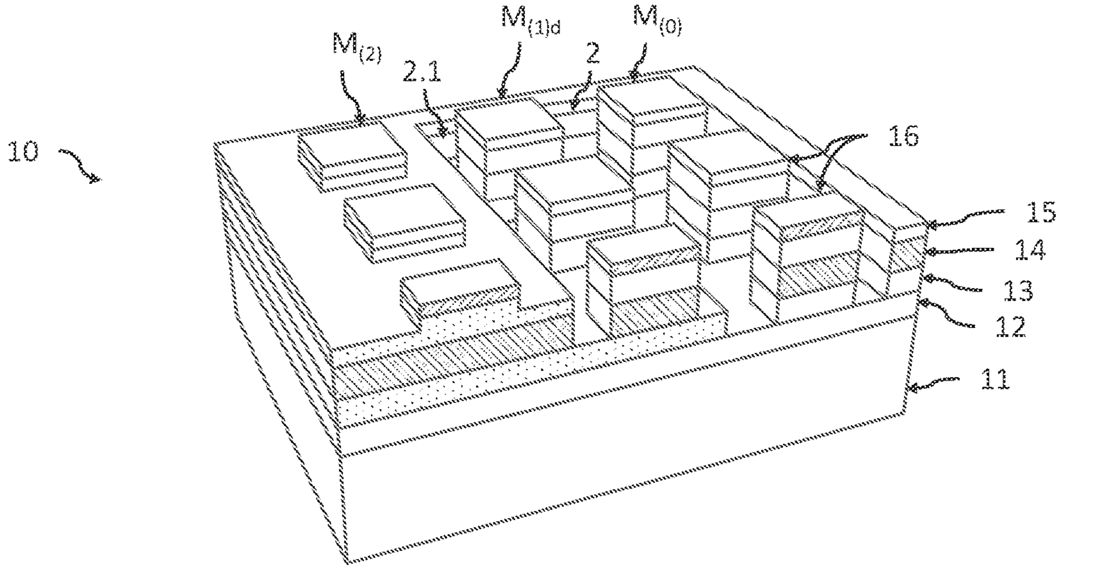

FIGS. 4A and 4B are schematic and partial views, in cross-section (FIG. 4A) and in perspective (FIG. 4B), of a growth substrate 10 similar to that of FIG. 1C, to the extent that it includes several mesas $M_{(0)}$, several mesas $M_{(1)d}$ and several mesas $M_{(2)}$.

In this example, the growth substrate 10 is similar to that of FIG. 3A, and differs from it essentially in that the porous lower doped layer 13 of the mesas $M_{(1)d}$ is continuous with the latter, also porous, of the mesas $M_{(2)}$. In other words, the mesas of one category $M_{(n)}$ include a porous doped layer which is a portion of the same porous continuous layer which extends in a mesa of a different category $M_{(n+1)}$.

Thus, while a trench 2 which opens onto the insulation lower layer 12 separates the mesas $M_{(0)}$ from the mesas $M_{(1)d}$ and $M_{(2)}$ in the plane XY, another trench 2.1, less deep, opening onto the lower doped layer 13, separates the mesas $M_{(1)d}$ from the mesas $M_{(2)}$ in the plane XY at their upper doped layer 15. Thus, the same lower doped layer 13 of the mesas $M_{(1)d}$ and $M_{(2)}$ may be in contact with the same electrode 3 connected to the anode of the electric generator.

FIGS. 5A to 5H illustrate different steps of a method for manufacturing a growth substrate 10 similar to that of FIG. 1B, then the optoelectronic device 1. In this example, the diodes are electroluminescent, and the optoelectronic device 1 is a microscreen with an RGB native emission.

Figure 5A:
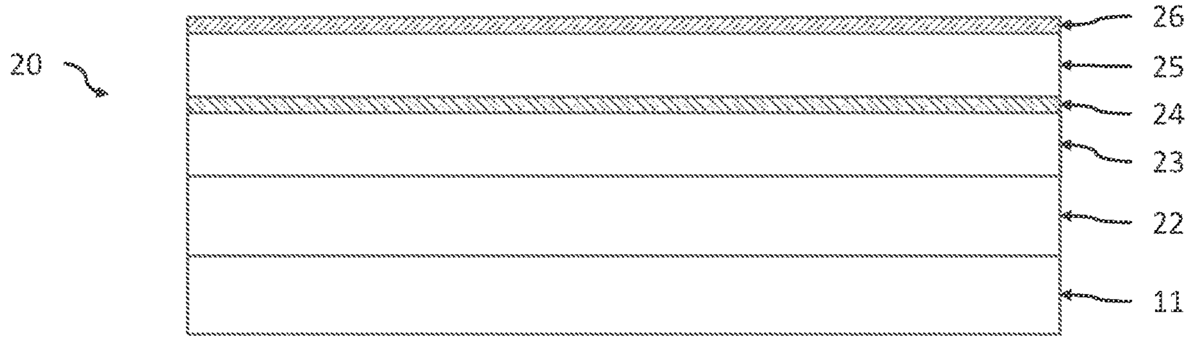
FIGS. 5A to 5H illustrate different steps of a method for manufacturing an optoelectronic device including a growth substrate similar to that of FIG. 1B, where the epitaxy regrowth layer is carried out before the electrochemical porosification step.

Referring to FIG. 5A, a crystalline stack 20 is first provided, including, over a support substrate 11 which extends in the main plane XY: an insulation lower continuous layer 22, a lower doped continuous layer 23, an insulation intermediate continuous layer 24, an upper doped continuous layer 25, and herein an epitaxy regrowth continuous layer 26. These layers extend in the plane XY continuously over the entire extend of the support substrate 11. The different layers are obtained by successive steps of epitaxy starting from the support substrate 11.

The insulation lower layer is made of a crystalline material that cannot be porosified based on GaN, herein made of unintentionally doped GaN. The lower doped continuous layer 23 as well as the upper doped continuous layer 25 are made of a crystalline material that can be porosified based on GaN, herein made of $In_xGa_{1-x}N$, with an indium proportion x which is preferably comprised between 0% and 15%. In this example, the indium proportion x of the layers 23 and 25 is different from zero. The InGaN is n-type doped between $3\times10^8$ $cm^{-3}$ and $1.5\times10^9$ $cm^{-3}$, for example equal to about $6\times10^8$ $cm^{-3}$. The thickness is herein comprised between 50 nm and 1 μm, for example equal to about 800 nm. The insulation intermediate continuous layer 24 and the epitaxy regrowth continuous layer 26 are made of a crystalline material that cannot be porosified based on GaN, herein made of InGaN (in this example, the indium proportion x is different from zero) unintentionally doped or slightly doped.

Figure 5B:
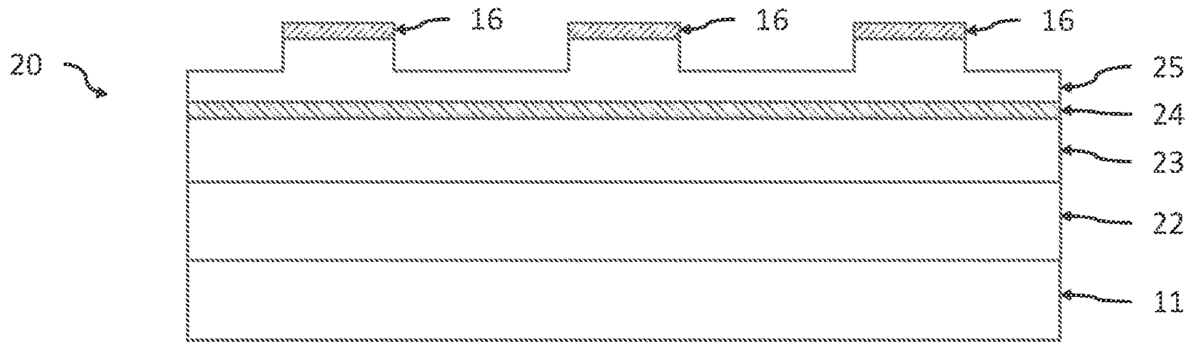

Referring to FIG. 5B, a localized etching of the epitaxy regrowth continuous layer 26 is carried out herein, to form nucleation plots (forming the epitaxy regrowth layers 16), distinct from each other in the plane XY, intended for making the diodes $D_{(i)}$, and open into the upper doped continuous layer 25 (herein forming a top portion and a continuous bottom portion). In particular, etching may be carried out by a plasma ICP-RIE type process in chlorinated gas. This optional first step allows making the epitaxy regrowth layers 16 of the mesas $M_{(0)}$, $M_{(1)}$ and $M_{(2)}$, as well as top and bottom portions of the upper doped continuous layer 25 of the mesas $M_{(1)}$ and $M_{(2)}$.

Figure 5C:
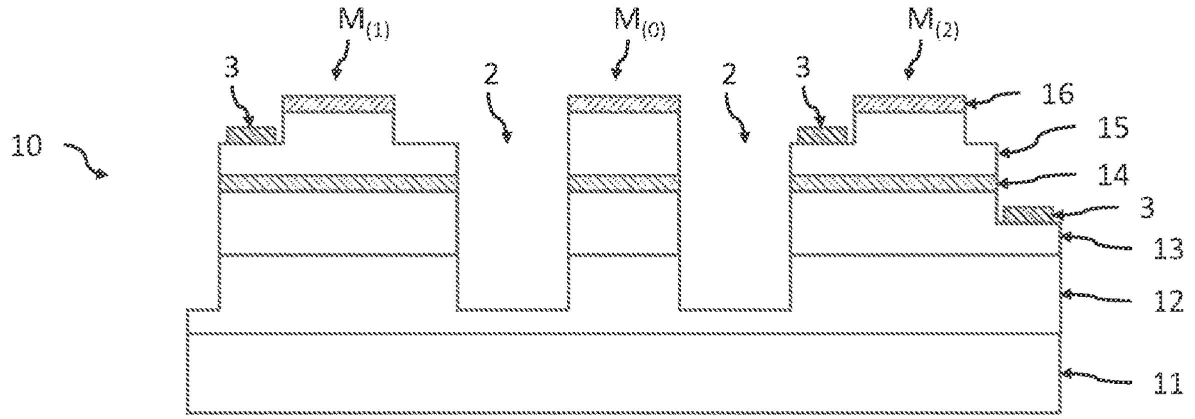

Referring to FIG. 5C, a localized etching of the upper doped continuous layer 25, of the intermediate continuous layer 24, and of the lower doped continuous layer 23 is carried out afterwards, to open into the lower continuous layer 22. Thus, one or more trench(es) 2 are formed allowing isolating the mesas $M_{(0)}$ from each other and from the mesas $M_{(1)}$ and $M_{(2)}$, and isolating the mesas $M_{(1)}$ from the mesas $M_{(2)}$, in the plane XY.

The mesas $M_{(1)}$ herein include an upper doped layer 15, intended to be made porous, common from one mesa to another and are also connected to each other by this same upper doped layer 15 (like in FIG. 3A). Similarly, the mesas $M_{(2)}$ herein include upper 15 and lower 13 doped layers, intended to be made porous, common from one mesa to another, and are connected to each other by these same upper 15 and lower 13 doped layers.

In this example, afterwards, an electrode 3 is deposited over and in contact with the upper doped layer 15 of the mesas $M_{(1)}$. This electrode 3 may extend over all mesas $M_{(1)}$, or over only mesas $M_{(1)}$ located at the boundary of the growth substrate 10. An electrode 3 is also made over and in contact with the upper doped layer 15 of the mesas $M_{(2)}$, and another electrode 3 over and in contact with the lower doped layer 13 of the mesas $M_{(2)}$. These electrodes 3 may be located in different manners, like for the electrode 3 of the mesas $M_{(1)}$.

Figure 5D:
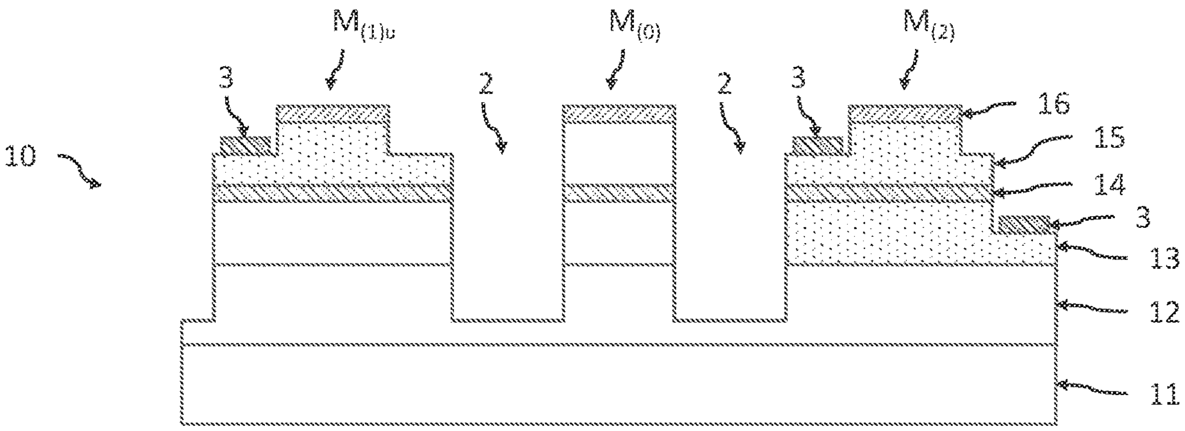

Referring to FIG. 5D, an electrochemical porosification of the upper doped layers 15 of the mesas $M_{(1)u}$, and of the upper 15 and lower 13 doped layers of the mesas $M_{(2)}$ is carried out afterwards, simultaneously. The upper 15 and lower 13 doped layers of the mesas $M_{(0)}$ are not made porous during this step because they are not electrically connected to the electric generator. In addition, the lower 13 doped layer of the mesas $M_{(1)u}$ is not made porous because the insulation intermediate layer 14, by its electrical resistance, prevents the porosification electrochemical reaction from taking place in his lower doped layer 13 (which should not be porosified).

For this purpose, the growth substrate 10 is immersed in a liquid electrolyte, the doped layers to be made porous being herein connected to the anode of the electric generator. A counter-electrode, herein a grid made of platinum with a larger deployed surface opposite the surface of the working electrode, is immersed in the electrolyte, and is connected to the cathode of the electrical generator. The electrical generator applies an electrical voltage $E_p$ whose value has been predetermined, which results in porosifying concerned layers, and therefore in a different relaxation of the different mesas. More specifically, the mesas $M_{(0)}$ have no layer made porous and have the relaxation rate $R_{(0)}$ which remains identical before and after the electrochemical porosification step; the mesas $M_{(2)}$ have their upper 15 and lower 13 doped layers which are made porous, which results in a maximum relaxation rate $R_{(2)}$, herein totally relaxing the epitaxy regrowth layers 16; and the mesas $M_{(1)}$ have only their upper doped layer 15 which has been made porous, which results in a relaxation rate $R_{(1)}$ comprised between and different from $R_{(0)}$ and $R_{(2)}$.

The liquid electrolyte may be acidic or basic, and may consist of oxalic acid. It may also consist of KOH, HF, $HNO_3$, $NaNO_3$, $H_2SO_4$ or mixture thereof. Thus, it is also possible to use a mixture of oxalic acid and $NaNO_3$. For example, the electrical voltage applied between the anode and the cathode may be comprised between 1V and 100V. It may be applied for a duration ranging from a few seconds to a few hours. Once there is no current anymore, the electrochemical reaction stops and the porosification of the corresponding doped layer is done.

Thus, a growth substrate 10 is obtained, including mesas $M_{(i)}$ having different relaxation rates $R_{(i)}$, and formed from the same original crystalline stack 20. This relaxation of the mechanical stresses differentiated from one mesas category to another is obtained during the same electrochemical porosification step, without it being necessary to make different doping levels from one mesas category $M_{(i)}$ to another. All of these mesas $M_{(i)}$ have an epitaxy regrowth layer 16 made of $In_xGa_{1-x}N$ with the same indium proportion x, but with a different relaxation depending on the considered different categories. Hence, they are all suited for making an array of diodes $D_{(i)}$ by epitaxy allowing emitting or receiving a light radiation at different wavelengths.

Referring to FIG. 5E to 5H, the array of diodes $D_{(i)}$ is manufactured afterwards, by resuming epitaxy starting from the mesas of the growth substrate 10. In this example, the diodes are electroluminescent. In this case, diodes $D_{(0)}$ are made starting from the mesas $M_{(0)}$, diodes $D_{(1)}$ starting from the mesas $M_{(1)}$, and diodes $D_{(2)}$ starting from the mesas $M_{(2)}$.

Figure 5E:
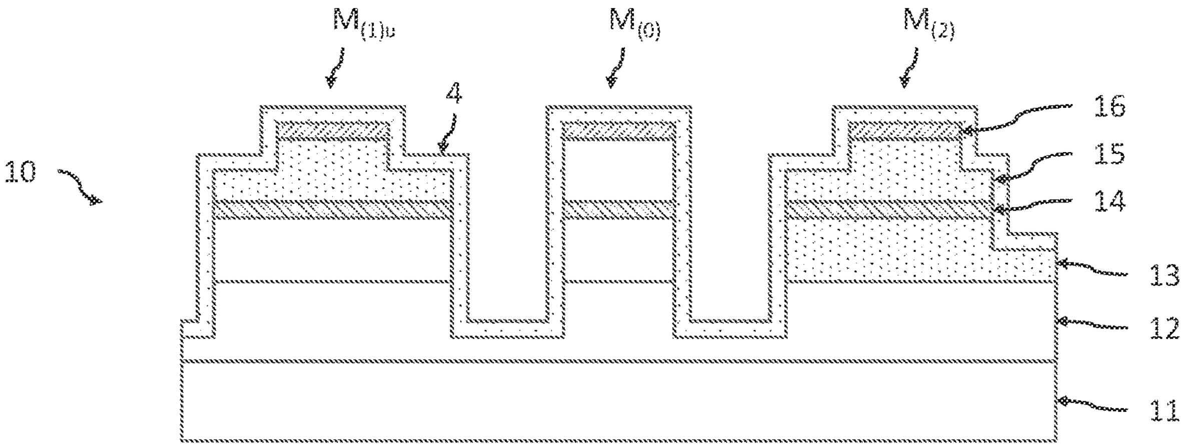
Figure 5F:
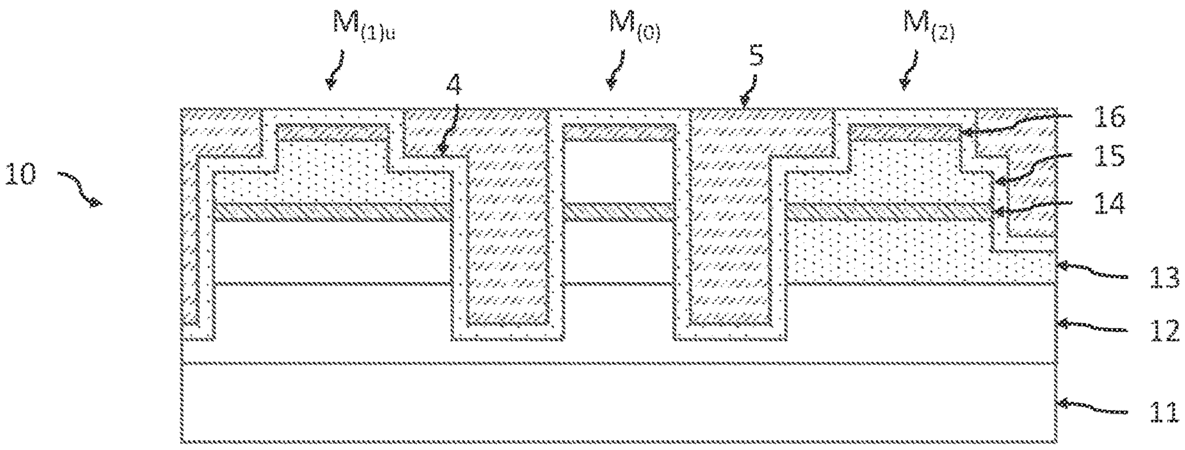
Figure 5G:
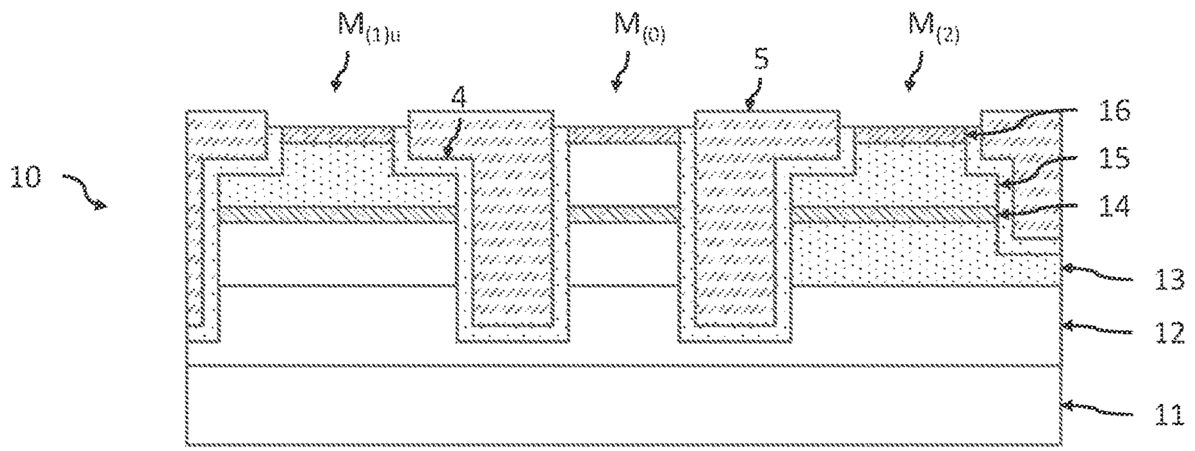

Referring to FIG. 5E to 5G, after having removed the electrodes 3 for example by selective chemical etching, a growth mask 4 is first made over the growth substrate 10, so as to entirely cover it except at the upper surfaces of the epitaxy regrowth layers 16.

First of all, a continuous thin layer 4 made of an electrically-insulating material such as a silicon nitride is conformally deposited (cf. FIG. 5E), for example an 80 nm thin layer of SiN deposited by plasma-enhanced chemical vapor deposition (PECVD). Thus, this insulating thine layer 4 completely covers the mesas $M_{(i)}$ as well as the free surface, located between the mesas $M_{(i)}$, of the insulation lower layer 12, and has a substantially constant thickness.

Afterwards, a filling thick layer 5 is deposited (cf. FIG. 5F), for example made of a polymer such as a lithography resin, over the insulating thin layer 4 so as to cover the mesas $M_{(i)}$. Afterwards, this thick layer 5 is thinned, for example by dry etching under $O_2$ plasma, until making free the upper surface of the insulating thin layer 4 located at the top of the epitaxy regrowth layers 16.

Figure 5H:
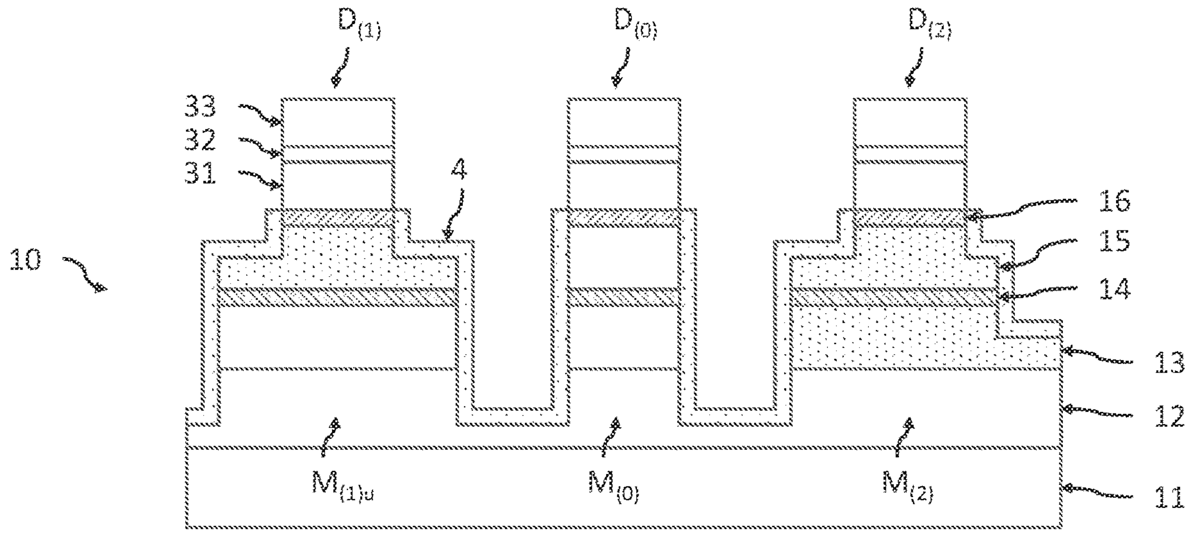

Finally, openings leading onto the upper surface of the epitaxy regrowth layers 16 are made (cf. FIG. 5G). For this purpose, the freed portions of the insulating thin layer 4 are selectively etched, for example by etching under fluorinated plasma. Afterwards, the thick layer 5 may be suppressed for example by dissolving in a solvent (as illustrated in FIG. 5H). Thus, a growth mask (the insulating thin layer 4) has been made, which covers the surface of the mesas $M_{(i)}$ and the surface of the insulation lower layer 12 located between the mesas, off the upper surface of the epitaxy regrowth layers 16. It consists of a self-aligned process where it has not been resorted to a photolithography step. Nonetheless, other processes may be used.

Referring to FIG. 5H, the diodes $D_{(i)}$ are made simultaneously, by resuming epitaxy starting from epitaxy regrowth layers 16 of the different mesas $M_{(i)}$. Thus, are formed:

- diodes $D_{(0)}$, starting from the mesas $M_{(0)}$, adapted to emit at a main wavelength $\lambda_0$, for example a blue light whose wavelength $\lambda_0$ is for example comprised between about 440 nm and 490 nm;
  - diodes $D_{(1)}$, starting from the mesas $M_{(1)}$, adapted to emit at a main wavelength $\lambda_1$, for example a green light whose wavelength $\lambda_1$ is for example comprised between about 495 nm and 560 nm; and
  - diodes $D_{(2)}$, starting from the mesas $M_{(2)}$, adapted to emit at a main wavelength $\lambda_2$, for example a red light whose wavelength $\lambda_2$ is for example comprised between about 600 nm and 650 nm.

This is possible because the epitaxy regrowth layers 16 of the mesas $M_{(0)}$, $M_{(1)}$ and $M_{(2)}$ have an effective lattice parameter different from one mesas category to another, because of the different relaxation rates $R_{(0)}$, $R_{(1)}$ and $R_{(2)}$. Also, the incorporation of indium in the diodes, and in particular in the quantum wells of the active layers, actually depends on the effective lattice parameter (and therefore on the relaxation rate) of the epitaxy regrowth layers 16 of the different mesas. The greater the effective lattice parameter of an epitaxy regrowth layer 16, the longer the main wavelength of the corresponding diode will be.

In this example, the epitaxy regrowth layer 16 of the mesas $M_{(0)}$ have the lowest relaxation rate $R_{(0)}$, so that it has an effective lattice parameter close to that of the insulation lower layer 12 made of GaN, which results in the diodes $D_{(0)}$ herein emitting in blue. Conversely, the epitaxy regrowth layer 16 of the mesas $M_{(2)}$ has the highest relaxation rate $R_{(2)}$, so that it has an effective lattice parameter close to that of bulk InxGa1−xN (the indium proportion may then be comprised between 10% and 20%, for example equal to 15%), thereby resulting in the diodes $D_{(2)}$ emitting in red. Between these two situations, the epitaxy regrowth layer 16 of the mesas $M_{(1)}$ has a the intermediate relaxation rate $R_{(1)}$ between and different from $R_{(0)}$ and $R_{(2)}$, so that the diodes $D_{(1)}$ could then emit in green.

The diodes $D_{(i)}$ include a minimum of two doped layers 31, 33, one n-type doped and the other p-type doped, and an active interlayer 32 including quantum wells. The doped layers 31, 33 and the active layer 32 may be multilayers (thus the quantum wells are conventionally located between barrier underlayers) and include other layers or sublayers such as an electron blocking layer.

For example, to obtain diodes $D_{(2)}$ emitting in red, diodes $D_{(1)}$ emitting in green, and diodes $D_{(0)}$ emitting in blue, each diode $D_{(i)}$ may have the following stacking (epitaxed starting from the epitaxy regrowth layer 16), from the bottom to the top:

- a thick layer (or substrate layer) made of InGaN, with an indium proportion comprised between about 10 and 20%, for example equal to 15%, n-type doped, and with a thickness comprised between 50 nm and 200 nm;
  - a multilayer based on n-type doped InGaN with a thickness of about 350 nm, formed by an alternation of 15 pairs of a 22 nm sublayer of $In_{0.15}Ga_{0.85}N$ and of a 1.8 nm sublayer of GaN, and possibly a 400 to 500 nm buffer layer of n-doped $In_{0.15}Ga_{0.85}N$;
- an active layer including multiple quantum wells formed by 5 pairs of In0.40Ga0.60N/$I_{0.15}Ga_{0.85}N$ with 2-3 nm and 5-8 nm thicknesses;
- a 10 nm spacing layer of unintentionally doped $In_{0.03}Ga_{0.97}N$;
- a 20 nm layer of AlN or of GaN doped with Mg;
- a 125 nm layer of InGaN doped with Mg with an indium proportion comprised between about 10 and 15%;
- a 25 n layer of p-type overdoped InGaN with the same indium proportion comprised between 10 and 15% as the underlying layer.

Moreover, the method for manufacturing the optoelectronic device 1 also includes a step of making polarization electrodes of the diodes $D_{(i)}$. This step is conventional and is not described herein.

Thus, an optoelectronic device 1 whose diodes $D_{(i)}$ are herein adapted to emit in a native manner at different wavelengths, herein in the three colors RGB, that being so thanks to the growth substrate 10 which has been made in one single electrochemical porosification step without having resorted to several steps of localized implantation of dopants, and which has allowed making the diodes $D_{(i)}$ in one single epitaxy regrowth step.

FIGS. 6A to 6D illustrate steps of a method for manufacturing a growth substrate 10 then the array of diodes $D_{(i)}$. This method differs from that of FIG. 5A to 5H essentially in that the epitaxy regrowth layer 16 of the mesas $M_{(i)}$ is made during the manufacture of the diodes $D_{(i)}$ and therefore after the electrochemical porosification step.

Figure 6A:
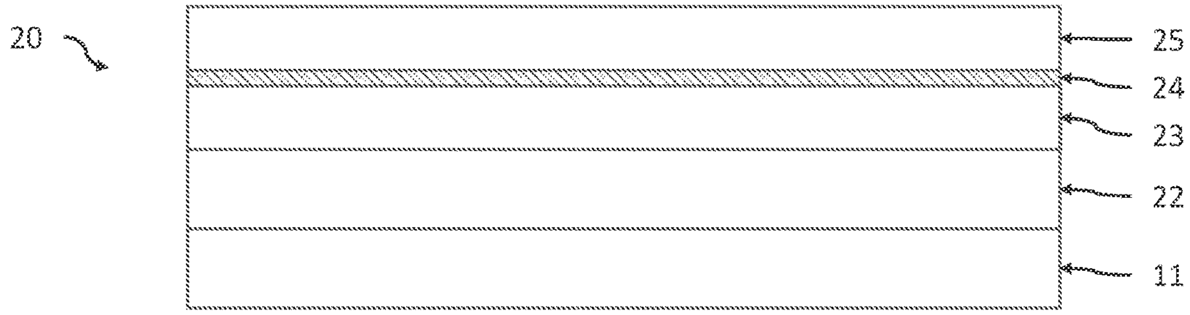
FIGS. 6A to 6D illustrate different steps of a method for manufacturing an optoelectronic device including a growth substrate similar to that of FIG. 1B, where the epitaxy regrowth layer is carried out after the electrochemical porosification step.

Referring to FIG. 6A, the crystalline stack 10 is made at first. The continuous layers 22, 23, 24 and 25 are identical to those of FIG. 5A. However, it does not include the epitaxy regrowth continuous layer 26.

Figure 6B:
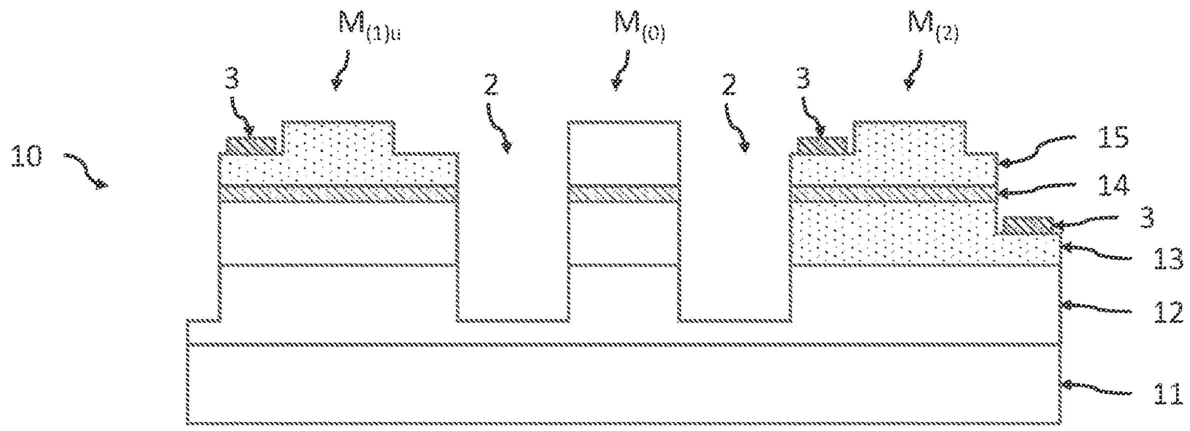

Referring to FIG. 6B, the mesas $M_{(i)}$ are made afterwards by localized etching of the crystalline stack 10, and the desired doped layers are porosified. Thus, the mesas $M_{(0)}$, $M_{(1)u}$ and $M_{(2)}$ are obtained. Note herein that the porous layers have become elastically deformable. They enable relaxation of the epitaxy regrowth layers 16 which will be made afterwards (and therefore of the mesas $M_{(i)}$.

Figure 6C:
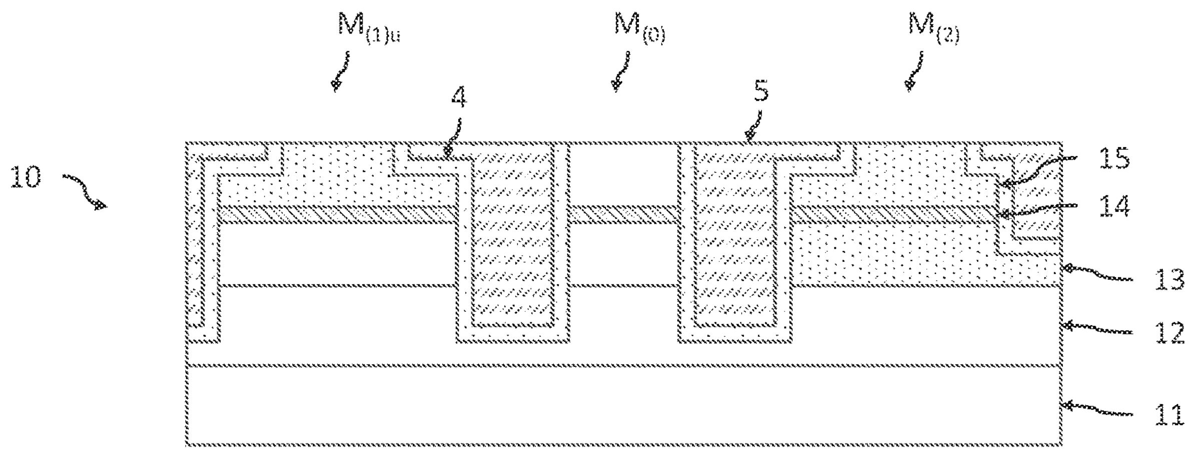

Referring to FIG. 6C, the electrodes 3 are removed, then the insulating thin layer 4 then the filling thick layer 5 are deposited. Afterwards, this thick layer 5 is thinned until making free the upper surface of the insulating thin layer 4 located over the upper face of the doped layers 15 of the mesas $M_{(i)}$.

Figure 6D:
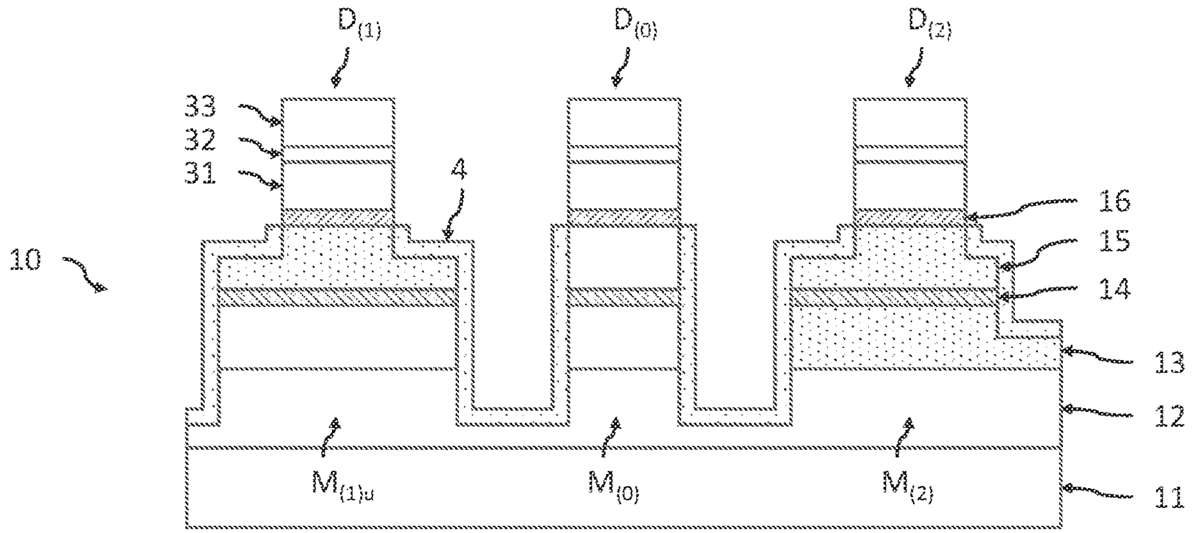

Referring to FIG. 6D, openings are made so as to make free the upper face of the doped layers 15 of the mesas $M_{(i)}$. Afterwards, the thick layer 5 may be suppressed. Thus, the growth substrate 10 is manufactured. In this case, the epitaxy regrowth layer 16 is still not deposited over each of the mesas $M_{(i)}$.

Finally, the different diodes $D_{(i)}$ are made simultaneously. For this purpose, it is possible to make a GaN based thin layer, and preferably made of InGaN with an indium proportion of about 1%, by epitaxy, with a thickness comprised between about 10 and 100 nm. This thin layer is made over and in contact with the doped layers 15 of the mesas $M_{(i)}$, and allows sealing off the pores opening out at the upper face of the porous doped layers 15. Afterwards, it is possible to make the epitaxy regrowth layer 16 by epitaxy at each mesa $M_{(i)}$. This layer 16 may have a thickness of about 200 nm and an indium proportion in the range of about 8%. It then causes the deformation of the porous layers of the mesas $M_{(1)}$ and $M_{(2)}$, which, in return, allows relaxing the layer 16.

Afterwards, the layers 31, 32, 33 of the diodes are made. It should be noted herein that the layer 31 could then serve as an epitaxy regrowth layer.

Particular embodiments have just been described. Different variants and modifications should appear to a person skilled in the art.

What is claimed is:

1. A growth substrate, suitable for epitaxial growth of an array of InGaN based diodes, comprising:

an insulation lower layer made of a GaN based non-porous crystalline material;

mesas $M_{(i)}$, made of GaN based crystalline materials, resting on and in contact with the insulation lower layer, and each including N doped layers, with N≥2, separated in pairs by an insulation intermediate layer made of a non-porous material, and each having a free upper face adapted for making a diode of the array by epitaxy; the mesas being configured according to at least three different categories including:

a category of mesas $M_{(N)}$ in which the N doped layers are porous;

a category of mesas $M_{(0)}$ in which none of the doped layers is porous;

a category of mesas $M_{(n)}$ in which n doped layers are porous, with 1≤n<N.

2. The growth substrate according to claim 1, wherein each mesa $M_{(i)}$ includes an epitaxy regrowth layer resting on an upper doped layer amongst the N doped layers, made of an InGaN based non-porous crystalline material whose lattice parameter $a^{m}_{cre}$ of the relaxed material is greater than the effective lattice parameter a cii of the insulation lower layer:

the epitaxy regrowth layer of each mesa of category $M_{(N)}$ having a maximum lattice parameter $a^{e}_{cre(N)}$;

the epitaxy regrowth layer of each mesa of category $M_{(0)}$ having a lattice parameter $a^{e}_{cre(0)}$ than $a^{e}_{cre(N)}$;

the epitaxy regrowth layer of each mesa of category $M_{(n)}$ having an intermediate lattice parameter $a^{e}_{cre(n)}$ lower than $a^{e}_{cre(N)}$ and different from $a^{e}_{cre(0)}$.

3. The growth substrate according to claim 1, wherein the intermediate insulation layer of each mesa has a thickness smaller than that of the adjacent doped layers.

4. The growth substrate according to claim 3, wherein the insulation intermediate layer of each mesa has a thickness comprised between 10 nm and 100 nm.

5. The growth substrate according to claim 1, wherein the insulation lower layer and the insulation intermediate layer have a doping level at most equal to $5\times10^{17}$ $cm^{-3}$.

6. The growth substrate according to claim 1, wherein the doped layers are n-type doped.

7. The growth substrate according to claim 1, wherein the lower doped layers of the mesas $M_{(i)}$ are made of the same material and have the same thickness from one mesa to another; the insulation intermediate layers of the mesas $M_{(i)}$ are made of the same material and have the same thickness from one mesa to another; and the upper doped layers of the mesas $M_{(i)}$ are made of the same material and have the same thickness from one mesa to another.

8. An optoelectronic device comprising: a growth substrate ac cording to claim 1; and an array of InGaN based diodes $D_{(i)}$, epitaxially grown from the mesas of the growth substrate, the diodes being configured to emit or detect a light radiation at different wavelengths, the wavelength being different from one category of mesas to another.

9. The optoelectronic device according to claim 8, which is an RGB microdisplay where the diodes $D_{(i)}$ are light-emitting diodes configured to emit a light radiation at least in blue and red.

* * * * *